United States Patent [19]

Solomon

[11] Patent Number: 5,349,823
[45] Date of Patent: Sep. 27, 1994

[54] INTEGRATED REFRIGERATED COMPUTER MODULE

[75] Inventor: Raymond Solomon, Penn Valley, Calif.

[73] Assignee: Intel Corporation, Santa Clara, Calif.

[21] Appl. No.: 125,040

[22] Filed: Sep. 22, 1993

Related U.S. Application Data

[63] Continuation of Ser. No. 837,353, Feb. 14, 1992.

[51] Int. Cl.5 .................... F25B 9/00; F25D 23/12; H05K 7/20
[52] U.S. Cl. .......................... 62/6; 62/259.2; 62/295; 62/297; 361/688
[58] Field of Search ............... 62/6, 51.1, 259.2, 295, 62/297, 298; 361/381–389; 357/80–83

[56] References Cited

U.S. PATENT DOCUMENTS

| | | | |
|---|---|---|---|
| 4,352,643 | 10/1982 | Iijima | 62/297 |
| 4,412,427 | 11/1983 | Horn et al. | 62/298 |
| 4,565,925 | 1/1986 | Anderson et al. | 62/51.1 X |
| 4,745,761 | 5/1988 | Bazaj et al. | 62/295 X |
| 4,812,733 | 3/1989 | Tobey | |
| 4,930,318 | 6/1990 | Brzozowski | 62/295 X |
| 4,977,748 | 12/1990 | Diedrich | 62/51.1 |
| 5,056,317 | 10/1991 | Stetson | 62/6 |
| 5,121,292 | 6/1992 | Bell et al. | 361/381 X |
| 5,129,232 | 7/1992 | Minas et al. | 62/295 X |
| 5,142,443 | 8/1992 | Moore, Jr. | 361/386 X |

FOREIGN PATENT DOCUMENTS

2139745  11/1984  United Kingdom ............ 62/259.2

*Primary Examiner*—Henry A. Bennet
*Assistant Examiner*—Christopher Kilner
*Attorney, Agent, or Firm*—Blakely, Sokoloff, Taylor & Zafman

[57] ABSTRACT

The present invention is an integrated computer module that has a chip carrier assembly attached to a cryogenic cooler. The carrier assembly includes a multichip that has a CPU comprising a plurality of high speed chips. The carrier also has a plurality of external pins that allow the chips to be coupled to an external device. Attached to the carrier is a vacuum-sealed enclosure constructed to eliminate moisture condensation on the pins, and minimize the heat flow from the ambient to the coldplate of the cooler. The vacuum-sealed enclosure is connected to the coldplate with springs to ensure good thermal contact between the cooler and the carrier assembly. The refrigerator runs on a Stirling cycle and contains pressurized helium as the cooling fluid. The coldplate temperature can be maintained at a constant temperature as low as −60° C. while removing 40 watts of active heat load generated by the CPU.

5 Claims, 3 Drawing Sheets

INTEGRATED REFRIGERATED COMPUTER MODULE

This is a continuation of application Ser. No. 07/837,353 filed Feb. 14, 1992.

BACKGROUND OF THE INVENTION

1. Field of the Invention

The present invention relates to the packaging of one or more integrated circuits in a single detachable module and refrigeration systems for cooling the same to substantial subambient temperatures.

2. Description of Related Art

It has been recognized for a number of years that the upper limits on the operating speed of digital circuits is temperature dependent, with such circuits having the capability of operating at higher speeds at reduced temperatures. To this end, various techniques have been used to cool the central processing unit of computers so that a higher clock speed may be used. These techniques generally differ substantially from the more conventional cooling techniques of free and forced convection cooling using ambient air, which techniques are normally used to avoid failure of the circuitry due to overheating and/or to allow higher ambient temperature operating conditions without failure of the circuitry.

One method of cooling a central processing unit of a computer is to immerse the same in a liquified gas such as liquid nitrogen. This has the advantage of cooling the unit to a very low (cryogenic) temperature, allowing a very substantial increase in the operating speed thereof. It also has the advantage of good heat transfer between the central processing unit and the cooling medium, which is advantageous for central processing units having a high heat dissipation per unit volume occupied thereby. Such cooling techniques have substantial disadvantages however, in that liquified gasses are difficult to store and must be frequently replenished. They are also bulky and expensive, and thus heretofore generally only used for large computer systems. Such cooling techniques have not generally been used for smaller computer systems, including desk-top and desk-side systems such as work stations and personal computers, because of the more casual, often less frequent use thereof and the greater relative difficulties of providing and maintaining liquified gasses for any period of time in such small quantities.

Solid state coolers, utilizing the Peltier effect have been considered for cooling the central processing unit of desk-top computers. However, these devices are too inefficient to cool the relatively large amounts of heat generated by present and future high speed CPU's. Such coolers demand very large power supplies which add substantially to the cost and bulk of the computer. Furthermore, inadequate consideration has been given to packaging the semiconductor chips for reliable operation at sub-ambient temperatures, where condensed moisture may effect the long term reliability of the CPU.

Closed cycle mechanical refrigerators have also been considered for cooling CPU's to sub-ambient temperatures. These may include freon refrigerators using the Rankine thermodynamic cycle, coolers utilizing the Joule-Thompson effect, and other mechanical refrigerators. In general, these refrigerators require large and bulky compressors, or large, heavy motors which are incompatible with the space requirements for desk-top and desk-side computers. In addition, these refrigerators utilize gears, bushings, bearings, mechanical linkages, and other moving components which wear over time, requiring the use of oil reservoirs and lubricants, which degrade with extended use and under severe operating conditions. Furthermore, most of these systems lack hermaticity, resulting in leakage of the cooling fluid, or diffusion of impurities into the cooling fluid. Consequently, mechanical refrigerators have acquired a reputation for unacceptable reliability for applications in PC and workstation markets.

SUMMARY OF THE INVENTION

The present invention is an integrated computer module that has a chip carrier assembly attached to a cryogenic cooler. The carrier assembly includes a multichip carrier that has a CPU comprising a plurality of high speed chips. The carrier also has a plurality of external pins that allow the chips to be coupled to an external device. Attached to the carrier is a vacuum-sealed enclosure constructed to eliminate moisture condensation on the pins, and minimize the heat flow from the ambient to the coldplate of the cryogenic cooler. The vacuum-sealed enclosure is connected to the coldplate with springs to ensure good thermal contact between the cooler and the carrier assembly. The refrigerator is a specially designed single cycle free-piston Stirling refrigerator that contains helium under high pressure as the cooling fluid. An external heat exchanger is coaxially attached to the hot surface of the refrigerator, and cooling air is drawn over the heat exchanger by a fan mounted coaxially, and behind the refrigerator. The entire package is very compact, low in weight, and exhibits high efficiency and high reliability. The coldplate temperature can be maintained at a constant temperature as low as $-60°$ C. while removing 40 watts of active heat load generated by the CPU. Lower temperatures and higher heat loads can be achieved, however, the optimum operating temperature is a compromise between size, weight, efficiency, and reliability of the semiconductor chips, which may be effected by the "hot carrier effect".

Therefore it is an object of this invention to provide a computer module that detachably connects a multichip carrier and a refrigeration unit such that the carrier and heat exchanger can be separated and repaired.

It is also an object of this invention to provide a computer assembly that has a multichip carrier and a refrigeration unit integrated into one module that can be easily inserted into and detached from a commercially available personal computer or workstation.

It is also an object of this invention to provide a multichip carrier that can be cooled to substantially reduced temperatures.

It is also an object of this invention to provide a multichip carrier that can be cooled to substantially reduced temperatures without requiring an environmental seal on the external connectors of the carrier.

It is also an object of this invention to provide a computer of desk-top or smaller size that can run at both room and substantially reduced temperatures.

BRIEF DESCRIPTION OF THE DRAWINGS

The objects and advantages of the present invention will become more readily apparent to those skilled in the art after reviewing the following detailed description and accompanying drawings, wherein.

DETAILED DESCRIPTION OF THE INVENTION

Figure 1:
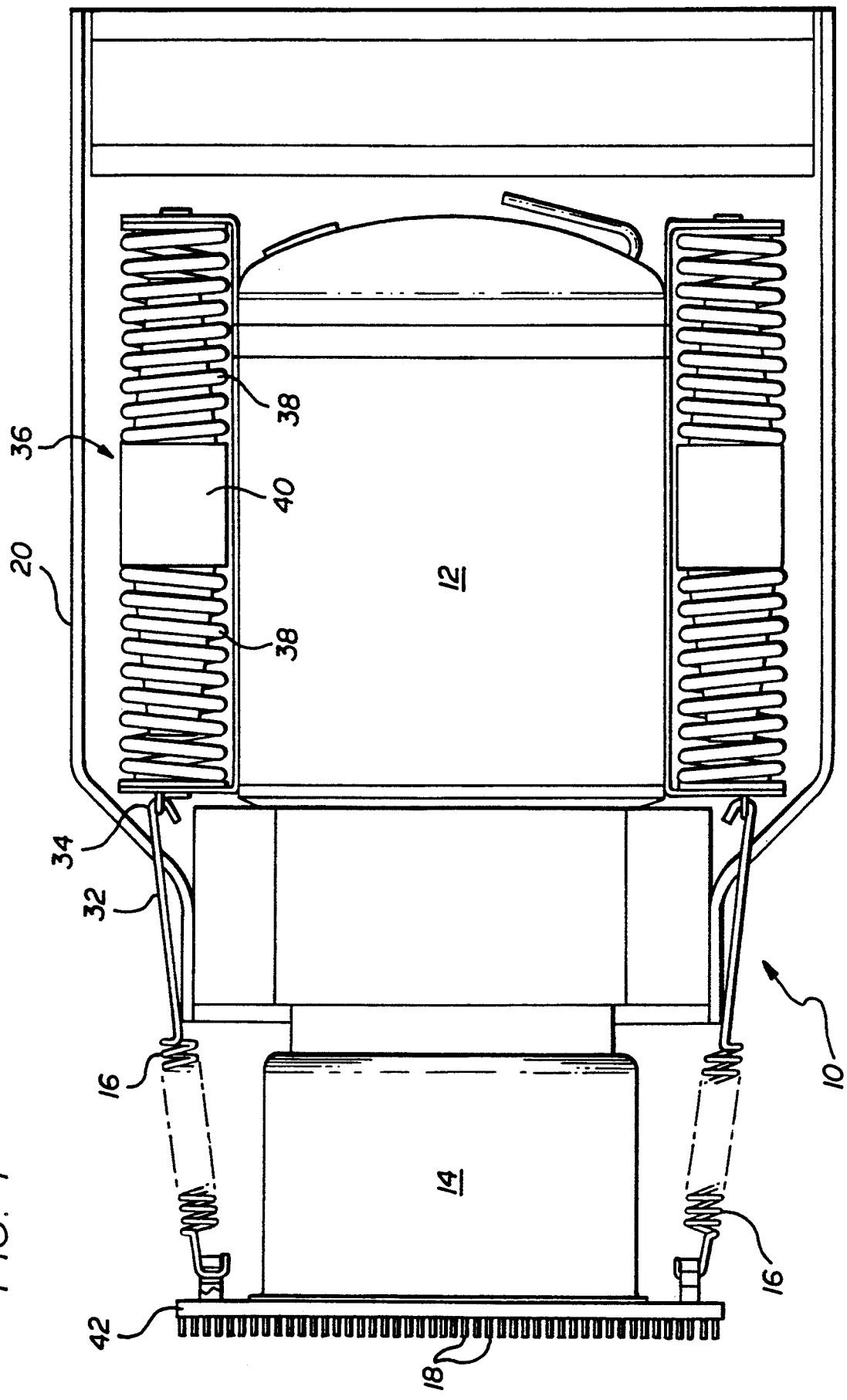
FIG. 1 is a side view of a computer module of the present invention showing a refrigeration unit attached to a multichip carrier by springs connected to both the carrier and the refrigeration unit.

Referring to the drawings more particularly by reference numbers, FIG. 1 shows an integrated computer module 10 of the present invention. The module 10 includes a refrigeration unit 12 and a multichip carrier assembly 14 connected by springs 16. The carrier assembly 14 has a plurality of external pin connectors 18 that can plug into mating sockets of a connector which electrically couple the module 10 to other external devices. The module 10 can become a part of a system such as a personal computer or a workstation, wherein the module 10 could contain the central processing unit (CPU) and/or high speed memory (cache or possible even bulk memory) of the computer. As shall subsequently be seen, the module is constructed so that the "electronics" can be easily detached and repaired.

The module 10 may have a housing 20 to protect a major portion of the refrigeration unit 12 and to enclose a coaxial heat exchanger 11 for the hot side of the refrigerator. The refrigeration unit 12 is preferably constructed to run in a single stage Stirling Cycle and is preferably capable of cooling down to −50° C. or lower with a heat load of around 40 watts. The Stirling Cycle refrigerator uses a high pressure helium as the cooling fluid and uses non-contact bearings to increase the life of the cooler. The refrigerator is hermetically sealed and uses no oils or lubricants. In the preferred embodiment, the module is about 8 inches long and 3½ inches square, small enough to allow the module to be installed in a desk-top personal computer. Such a cooler is capable of cooling a 40 watt heat source down to −50° C.

Figure 2:
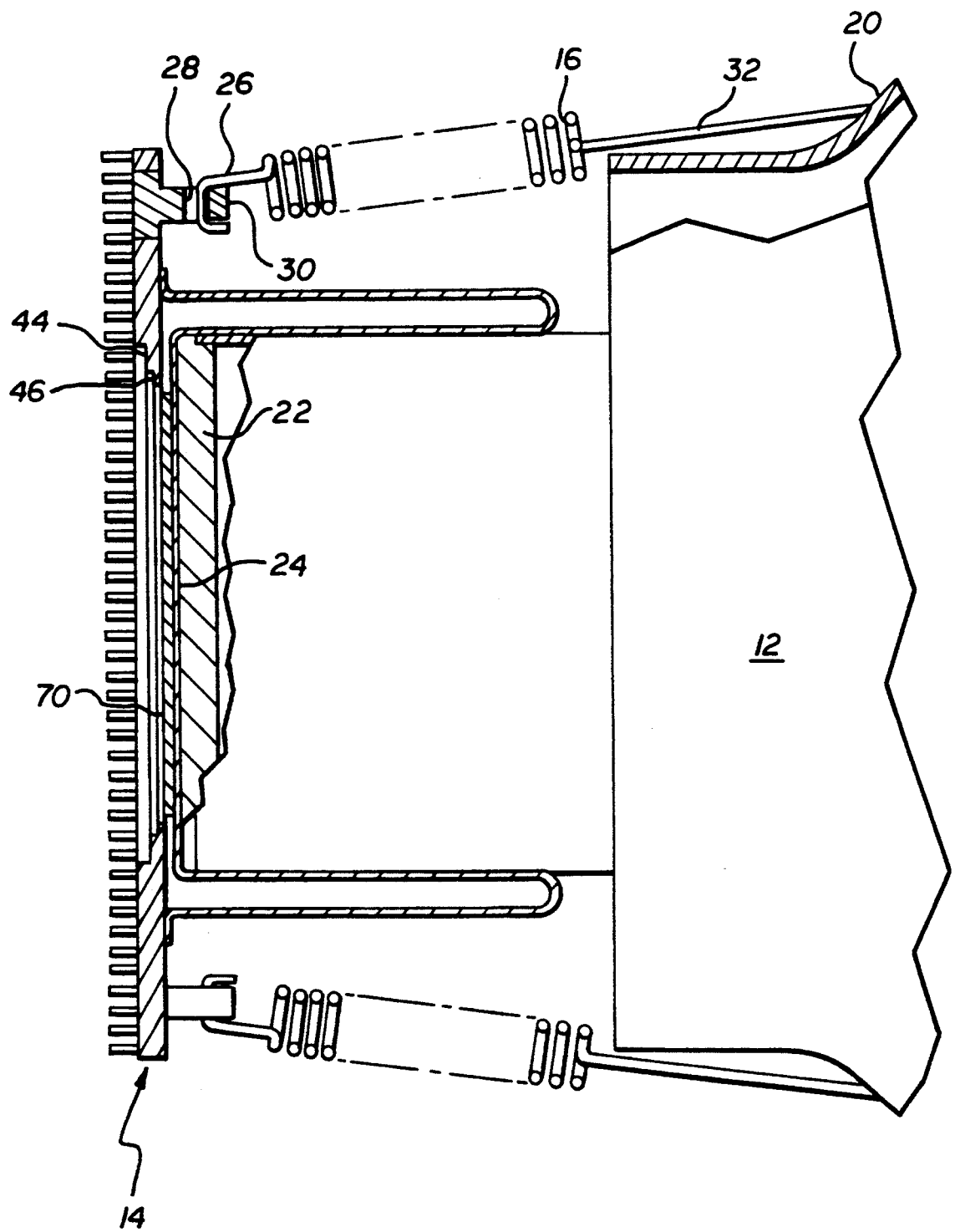
FIG. 2 is an enlarged sectional side view of the computer module of FIG. 1 showing a cold plate of the refrigeration unit pressed against a plate of the carrier.

As shown in FIG. 2, the refrigeration unit 12 has a cold plate 22 that is the heat absorbing portion of the cooler 12. The cold plate 22 is pressed against a plate 24 of the carrier assembly 14 by the springs 16. When installed, the springs 16 are in tension so that there is a constant pressure on the cold plate 22 and plate 24. In this manner, the spring pressure reduces the thermal resistance between the cold plate 22 and plate 24. To further decrease the thermal resistance, thermal grease can be applied to the plate 24 to fill the voids between the two members and provide a better conductive path between the cold plate 22 and plate 24. Both the cold plate 22 and plate 24 should be as flat as possible to maximize the contact area between the two members. The springs 16 also provides a means to easily attach and detach the carrier assembly 14 from the refrigeration unit 12, allowing the two to be separated from each other. This is an important feature of this invention, in that both the carrier 14 and the cooler 12 may on occasion need servicing and repair or replacement, and the ability to change out one and not both allows for quick repairs, even field repair, at a minimum cost.

In the preferred embodiment, there are four springs 16 each with a tab end 26. The tab ends 26 are inserted through slots 28 located within studs 30 that extend from the carrier assembly 14. The opposite spring tab ends 32 are inserted through loops 34 extending from the refrigeration unit 12 as more clearly shown in FIG. 1. Typically the tab ends 26 will be first installed in the studs 32, wherein the cooler 12 and chip carrier 14 are attached and separated by stretching the springs 16 and inserting or removing the end tabs 32 from the loops 34.

The refrigeration unit preferably has a damper 36 on each corner of the unit 12. Each damper 36 has a pair of damper springs 38 that support a mass 40. The springs 38 have a spring constant and the mass 40 has a weight chosen such that the damper 36 has a natural frequency approximately equal to the operating frequency of the refrigeration unit 12. Thus movement of the mass is 180 degrees out of phase with the cooler internal components, so that the damper 36 offsets any vibrational loading on the module 10. In effect, the case or housing of the cooler is a node (relatively motionless) between the oscillating internal parts of the cooler and the vibrating damper mass, at least for the primary vibration frequency.

Figure 3:
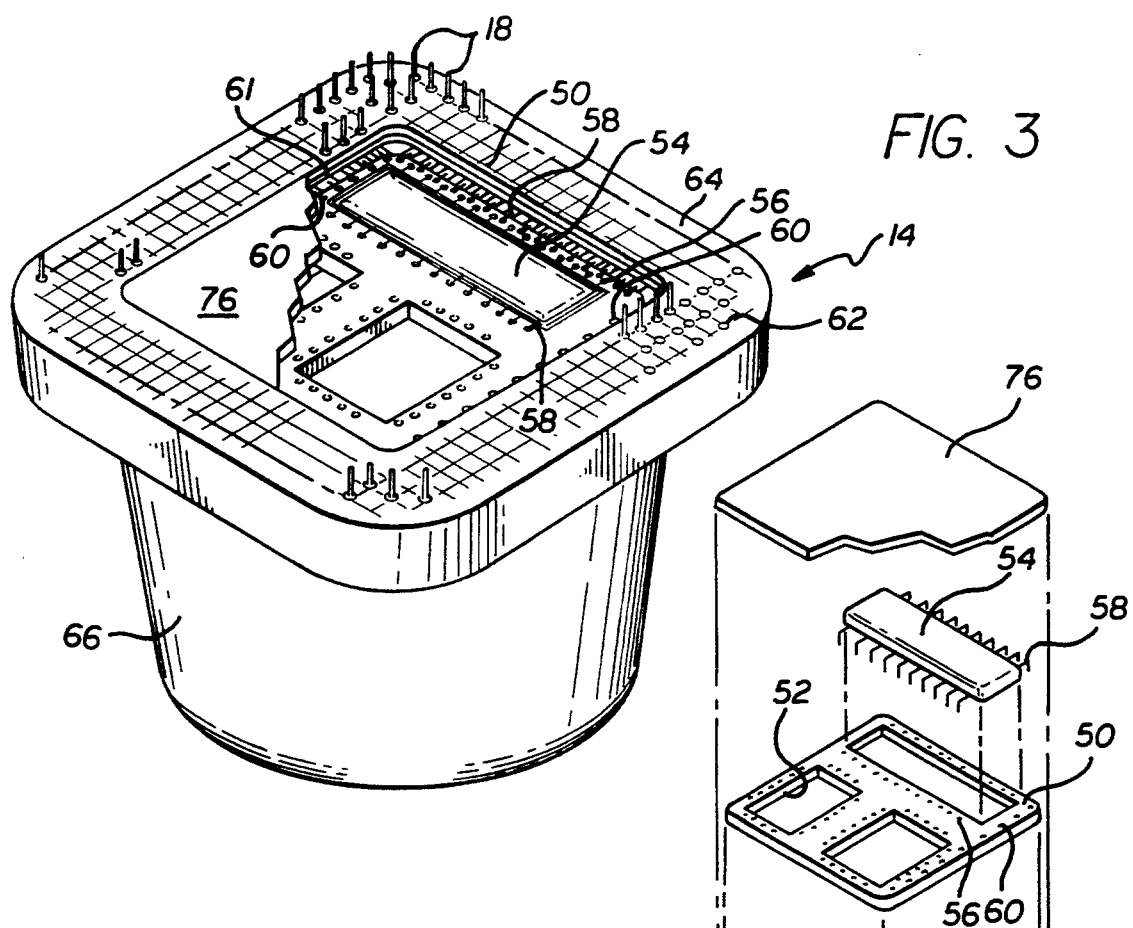
FIG. 3 is a perspective view of a multichip carrier showing chips mounted within a ceramic housing and a plurality of pins extending from the carrier.
Figure 4:
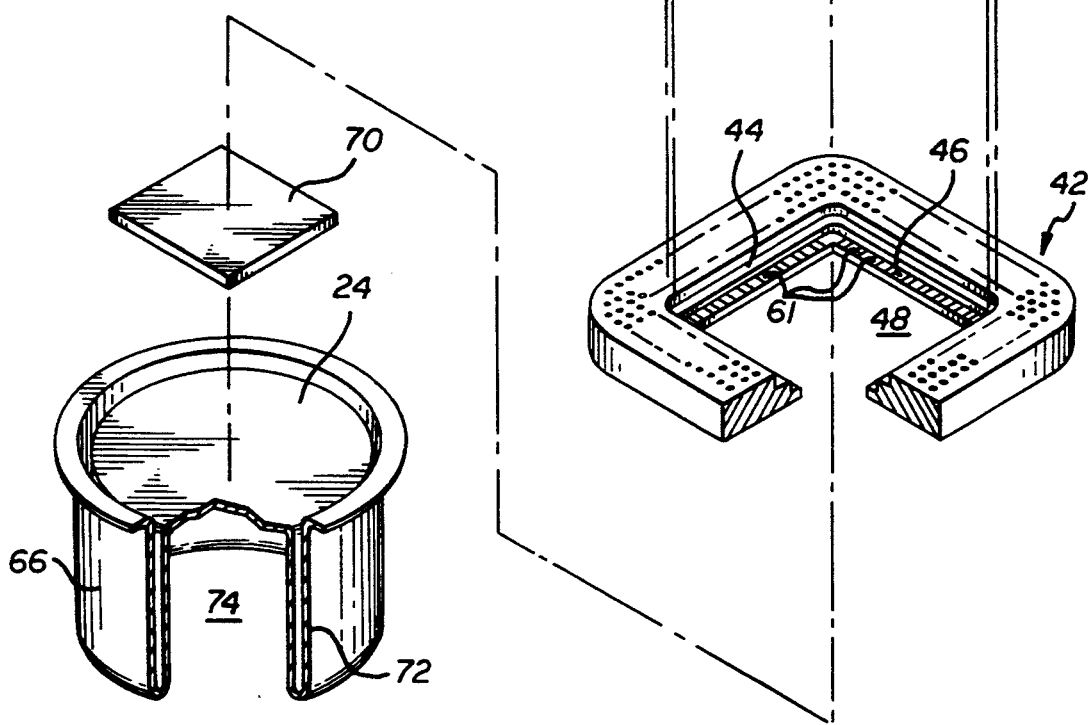
FIG. 4 is an exploded view of the multichip carrier of FIG. 3 showing the different components of the carrier.

FIGS. 3 and 4 show a more detailed view of the multichip carrier assembly 14. The assembly 14 has a housing 42 that is typically rectangular in shape and has first 44 and second 46 shelves extending around the inner cavity 48 of the housing 42. The inner cavity 48 is of such size to allow a chip module 50 to be mounted within the housing 42. Chip pockets 52 are formed in the module that hold chips 54 that are electrically coupled to surface pads 56 on the module 50 by wire leads 58. The surface pads 60 are connected to the internal conductors of the module 50 to allow communication between the chips 54. The module 50 also has surface pads 60 on the outer edges that are electrically coupled by wire leads 58 to surface pads 61 on the housing 42. The surface pads 61 are electrically connected to a plurality of plated holes 62 formed into the connector surface 64 of the housing 42. Inserted within the plated holes 62 are a plurality of the pin connectors 18 that can be inserted into a mating connector as previously described. The pin connectors 18 may be pogo pins which are commercially available and known in the art. The pin connectors 18 allow the chips 54 to communicate with electrical devices external to the module 14. The housing 42 is preferably constructed from a ceramic material, wherein the studs 30 and slots 28 are formed in the housing 42 when the ceramic is fired.

Attached to the housing 42 is a enclosure 66 which is preferably constructed from a material having a low thermal conductivity, such as a thin (0.015″) KOVAR configured to minimize thermal conduction and to support a substantial vacuum therein and cofired onto the housing 42. The enclosure 66 includes the plate 24 and is constructed in the configuration as shown in FIG. 4. When the enclosure 66 is attached to the housing 42, a pedestal 70 is attached to the plate 24, and pins 18 are fused into plated holes 61. The pedestal 70 is brazed to the enclosure 66 and is preferably constructed from copper molybdenum, which has a low coefficient of thermal expansion and high thermal conductance. The enclosure 66 has an annular double sided wall 72 that forms an annular sleeve 74 which both guides and supports the refrigeration unit 12. After the enclosure 66 and pedestal 70 have been attached to the housing 42, the chip module 50 and assembled chips 54 are mounted onto the pedestal 70 and the wire leads 58 are pressure welded onto the surface pads of the module 50 and housing 42 as more clearly shown in FIG. 3. A lid 76 is then seated within the first shelf 44 of the housing 42 and the inner cavity 48 is hermetically sealed to prevent contamination of the chips 54. Either during or after sealing the cover, the enclosure is evacuated, preferably to $10^{-3}$ to $10^{-5}$ atmospheres of dry gas, to grossly reduce thermal conduction through the gas in the enclosure. The housing 42, enclosure 66 and lid 76 are typically constructed from a ceramic that has a thermal expansion coefficient approximately the same as the material of the chips. This reduces the amount of strain induced on the wire leads 58 during the thermal expansion and contraction of carrier 14, which occurs every time the cooler 12 is turned on and off.

Once the carrier 14 is assembled, the refrigeration unit 12 is attached to the assembly 14 by the springs 16. The cold plate 22 is pressed against the plate 24 which is adjacent the chips 54. The pedestal 70 and plate 24 create a direct conductive heating path from the chips 54 to the cooler 12, providing a very thermally efficient assembly. The space between the enclosure walls 72 creates a long thermal path from the cold plate 22 to the housing surface 64, which prevents excessive cooling of the pins 18. Maintaining the pins 18 at a higher temperature than the cooler 12 prevents condensation from forming on the pins 18, which could short the chips 54. Such an arrangement eliminates the need for an environmental seal which typically require means to compress the seal, adding to the overall complexity and cost of the module.

The chips 54 can include memory and processing circuits to allow the module to function as the central processor of a computer. The chips 54 may also include very high speed integrated circuits which optimally run at temperatures ranging from 0° to −50° C. When the module 10 is first turned on, the cooler 12 takes time to cool the carrier 14 to such temperatures because of the thermal inertia of the refrigeration unit 12 and assembly 12. During the time that the refrigeration unit 12 is cooling the carrier 12 down to high frequency operating temperatures, it is desirable to have the module 10 run at a reduced frequency so that a user can operate the computer immediately after the system is turned on. To allow the module to operate at both room and cryogenic temperatures, a pulse clock may be incorporated into the carrier assembly 14 that switches or gradually changes from a first frequency to a second faster frequency as the chips reach a predetermined temperature, typically below 0° C. With such a clock, the module 10 is able to run at a standard slow frequency while the refrigeration unit 12 is cooling the carrier 14 down, and switch or gradually shift to a higher speed as the chips 54 are cooled to a temperature at which the computer can run at high speeds. Alternatively, a temperature sensor within the enclosure may be used to control an external system oscillator.

The present invention has the advantage that a small single-stage Stirling cycle refrigeration system together with a readily detachable integrated circuit module may be fabricated of a size suitable for use in desk-top computers such as personal computers and work stations, and at the same time achieve sufficiently reduced operating temperatures to allow a substantial increase in the operating speed thereof. By choosing an operating temperature for the integrated circuit refrigeration system in the range of 0° C. to −50° C., a substantial speed-up in the circuitry within the integrated circuit package, typically a central processing unit for a computer, may be achieved for typical processors manufactured for use with ambient air convection or forced convection cooling. This is a very important aspect of the invention in that the present invention, allows the use of mass produced processors and support circuitry (memories and the like) in conjunction with the present invention to speed up the operation thereof, as opposed to requiring special processors for very low temperature operation which will not operate with room ambient air natural or forced convection cooling. The very low production volume of processors suitable for operating at cryogenic temperatures grossly increases the cost thereof, further compounding the cost, bulk, and inconvenience of liquified gas and cryogenic refrigeration systems. Thus, the present invention is ideally suited for use in desk-top (and perhaps ultimately even smaller) computer systems of relatively high performance and relatively low cost utilizing mass produced processors and associated devices to achieve substantially higher operating speeds than normally available through ambient air cooling techniques, all while still maintaining relatively low cost repairability by swapping out the defective module as opposed to requiring the disassembly of the bulky refrigeration system to remove the electronic parts to be cooled therefrom.

While a certain exemplary embodiment has been described in detail and shown in the accompanying drawings, it is to be understood that such embodiment is merely illustrative of and not restrictive on the broad invention, and that this invention not be limited to the specific constructions and arrangements shown and described, since various other modifications may occur to those ordinarily skilled in the art.

What is claimed is:

1. A computer module, comprising:
    a chip carrier that has at least one pin extending from a first surface of said chip carrier, said chip carrier containing at least one electronic device that is capable of generating heat, said chip carrier further having a cold plate opposite from said first surface, said chip carrier having a pair of lugs;
    a cryogenic cooler adapted to remove said heat generated by said electronic device, said cryogenic cooler having a pair of lugs;
    a enclosure attached to said chip carrier, said enclosure having a wall adapted to support said cryogenic cooler and a base adjacent to said cold plate, said enclosure being constructed such that said cryogenic cooler is in contact with said base such that said heat flows from said cold plate through said base and into said cryogenic cooler, said enclosure wall having a first portion that extends from said base toward said cryogenic cooler and a second portion that extends from said first portion and is connected to said chip carrier, said first portion and said second portion being substantially separated by a vacuum channel such that the thermal path along said wall is along the entire lengths of said first and second portions; and,
    at least two springs that have hooks attached to said lugs of said chip carrier and said cryogenic cooler, wherein said springs exert a force that presses said cryogenic cooler into operative contact with said base of said enclosure.

2. The module as recited in claim 1, wherein said cryogenic cooler runs in a Stirling cycle.

3. The module as recited in claim 2, further comprising damper means operatively connected to said cryogenic cooler and said attachment means for dampening a vibrational excitation of said cryogenic cooler.

4. The module as recited in claim 3, wherein said electronic device comprises a central processing unit that has an internal clock, said internal clock being capable of operating at a first frequency when said electronic device is greater than a predetermined temperature and operating at a second frequency when said electronic device is not greater than said predetermined temperature, wherein said second frequency is higher than said first frequency.

5. The module as recited in claim 4, wherein said predetermined temperature is approximately −50° C.

* * * * *